United States Patent
Shin et al.

(10) Patent No.: US 12,035,489 B2
(45) Date of Patent: Jul. 9, 2024

(54) ELECTRONIC DEVICE INCLUDING HOUSING

(71) Applicant: Samsung Electronics Co., Ltd., Gyeonggi-do (KR)

(72) Inventors: Youngjong Shin, Gyeonggi-do (KR); Hangyu Hwang, Gyeonggi-do (KR); Changsu Kim, Gyeonggi-do (KR); Hyeonwoo Lee, Gyeonggi-do (KR); Sungho Cho, Gyeonggi-do (KR); Jeonga Kang, Gyeonggi-do (KR); Hyunsuk Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/861,387

(22) Filed: Jul. 11, 2022

(65) Prior Publication Data
US 2023/0090870 A1    Mar. 23, 2023

Related U.S. Application Data

(63) Continuation of application No. PCT/KR2022/008315, filed on Jun. 13, 2022.

(30) Foreign Application Priority Data

Sep. 23, 2021    (KR) .......................... 10-2021-0125613

(51) Int. Cl.
*H05K 5/00*    (2006.01)
*G02B 3/00*    (2006.01)
(Continued)

(52) U.S. Cl.
CPC .............. *H05K 5/02* (2013.01); *G02B 3/005* (2013.01); *G02B 5/045* (2013.01); *H05K 5/0086* (2013.01);
(Continued)

(58) Field of Classification Search
CPC .......... H05K 5/02; H05K 5/0086; H05K 5/03; G02B 3/005; G02B 3/0025; G02B 3/0031; G02B 5/045
(Continued)

(56) References Cited

U.S. PATENT DOCUMENTS

2010/0276844 A1    11/2010    Han et al.
2011/0007453 A1 *    1/2011    Hsieh ................. G05B 19/4097
                                                          361/679.01
(Continued)

FOREIGN PATENT DOCUMENTS

CN    211843937 U    11/2020
CN    2021082443 A1 *    5/2021 .............. H04M 1/02
(Continued)

OTHER PUBLICATIONS

International Search Report dated Sep. 15, 2022.

*Primary Examiner* — Zhengfu J Feng
(74) *Attorney, Agent, or Firm* — Cha & Reiter, LLC

(57) ABSTRACT

According to an embodiment of the disclosure, an electronic device may include a housing including a rear plate including a first region having a first concavo-convex pattern formed therein, and a second region having a second concavo-convex pattern formed therein, and a processor disposed inside the housing. The first concavo-convex pattern and the second concavo-convex pattern may be integrally formed with the rear plate, and a first depth of the first concavo-convex pattern may be different from a second depth of the second concavo-convex pattern.

10 Claims, 11 Drawing Sheets

(51) Int. Cl.
  *G02B 5/04* (2006.01)
  *H05K 5/02* (2006.01)
  *H05K 5/03* (2006.01)

(52) U.S. Cl.
  CPC ............. *H05K 5/03* (2013.01); *G02B 3/0025* (2013.01); *G02B 3/0031* (2013.01)

(58) Field of Classification Search
  USPC ........................................................ 361/807
  See application file for complete search history.

(56) References Cited

U.S. PATENT DOCUMENTS

| | | | | |
|---|---|---|---|---|
| 2014/0268525 | A1* | 9/2014 | Hwang | ............... B29C 45/0053 |
| | | | | 361/679.01 |
| 2016/0112086 | A1* | 4/2016 | Lei | ..................... H04M 1/0266 |
| | | | | 455/566 |
| 2016/0255735 | A1* | 9/2016 | Han | ....................... G06F 1/1637 |
| | | | | 359/894 |
| 2017/0106810 | A1* | 4/2017 | Hattori | ................... B60K 35/00 |
| 2019/0289972 | A1* | 9/2019 | Lombardo | .......... H04M 1/0283 |
| 2020/0106869 | A1* | 4/2020 | Hu | .............................. F21V 3/00 |
| 2020/0221589 | A1 | 7/2020 | Han et al. | |
| 2021/0029233 | A1* | 1/2021 | Gao | .......................... B32B 7/12 |

FOREIGN PATENT DOCUMENTS

| | | | | |
|---|---|---|---|---|
| JP | 2003-159900 A | 6/2003 | | |
| KR | 10-2009-0094778 A | 9/2009 | | |
| KR | 10-2013-0019678 A | 2/2013 | | |
| KR | 10-2014-0112326 A | 9/2014 | | |
| KR | 10-2016-0105110 A | 9/2016 | | |
| KR | 10-2018-0028985 A | 3/2018 | | |
| KR | 20180028985 A | * 3/2018 | ............... G02D 3/00 | |
| KR | 10-2020-0085066 A | 7/2020 | | |
| KR | 10-2021-0029507 A | 3/2021 | | |
| KR | 10-2022-0149286 A | 11/2022 | | |
| KR | 10-2023-0004137 A | 1/2023 | | |

\* cited by examiner

ELECTRONIC DEVICE INCLUDING HOUSING

CROSS-REFERENCE TO RELATED APPLICATION(S)

This application is a continuation and is based on and claims priority under 35 U.S.C. § 120 to PCT International Application No. PCT/KR2022/008315, which was filed on Jun. 13, 2022, and claims priority to Korean Patent Application No. 10-2021-0125613, filed on Sep. 23, 2021, in the Korean Intellectual Property Office, the disclosure of which are incorporated by reference herein their entirety.

BACKGROUND

Technical Field

One or more embodiments of the instant disclosure generally relate to an electronic device including a housing.

Description of Related Art

Owing to drastic development in information and communication technology and semiconductor technology, the distribution and use of various electronic devices are rapidly increasing. Particularly, recently portable electronic devices capable of communication functions are being developed.

In addition, electronic devices may output stored information as sound or images. As the capabilities of the electronic devices increase and ultra-high-speed and large-capacity wireless communication becomes common, an electronic device such as a mobile communication terminal may be equipped with various functions. For example, one such device may perform entertainment function such as games, multimedia function such as music/video playback, communication and security functions for mobile banking, schedule management, and electronic wallet function as well as communication function. Such electronic devices are being miniaturized so that users may conveniently carry them.

Recently, as miniaturization, thinness, or portability of portable electronic devices such as smart phones is emphasized, research is continuously conducted to improve the design of such devices.

SUMMARY

The demand for improving the design aesthetics of electronic devices is increasing. In order to achieve various colors or textures, an electronic device may include a housing on which a concavo-convex pattern is formed.

However, complex pattern may be difficult to realize with mechanical tools or chemical etching. For example, when mechanical tools or chemical etching are used, it is difficult to uniformly process the outer surface of the housing, in particular if the housing includes material that is difficult to cut (e.g., stainless steel or titanium), and the processing time of the housing may be increased. Moreover, when the concavo-convex pattern of the housing is formed using ultraviolet (UV) curing, the depth or thickness available for forming the housing may be limited. According to an embodiment of the disclosure, an electronic device may include a housing including a rear plate including a first region having a first concavo-convex pattern formed therein, and a second region having a second concavo-convex pattern formed therein, and a processor disposed inside the housing. The first concavo-convex pattern and the second concavo-convex pattern may be integrally formed with the rear plate, and a first depth of the first concavo-convex pattern may be different from a second depth of the second concavo-convex pattern.

According to an embodiment of the disclosure, a housing may include a front plate, and a rear plate including a first region having a first concavo-convex pattern of a first depth formed therein, and a second region having a second concavo-convex pattern of a second depth formed therein. The first concavo-convex pattern and the second concavo-convex pattern may be integrally formed with the rear plate.

Additional aspects will be set forth in part in the description which follows and, in part, will be apparent from the description, or may be learned by practice of the presented embodiments.

DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

A housing of an electronic device according to certain embodiments of the disclosure may include concavo-convex patterns formed using different processes. As the concavo-convex patterns are manufactured using the different processes, the shapes (e.g., depths) of the concavo-convex patterns are different, and the housing may provide various senses of depth and three-dimensional effect.

The housing of the electronic device according to certain embodiments of the disclosure may be manufactured using a single mold. Since the housing is manufactured using one mold, the manufacturing cost and manufacturing time of the housing may be reduced.

According to certain embodiments of the disclosure, an electronic device for providing various senses of depth and three-dimensional effect may be provided.

According to certain embodiments of the disclosure, a housing manufactured using a mold including a complex pattern having different depths may be provided.

Figure 1:
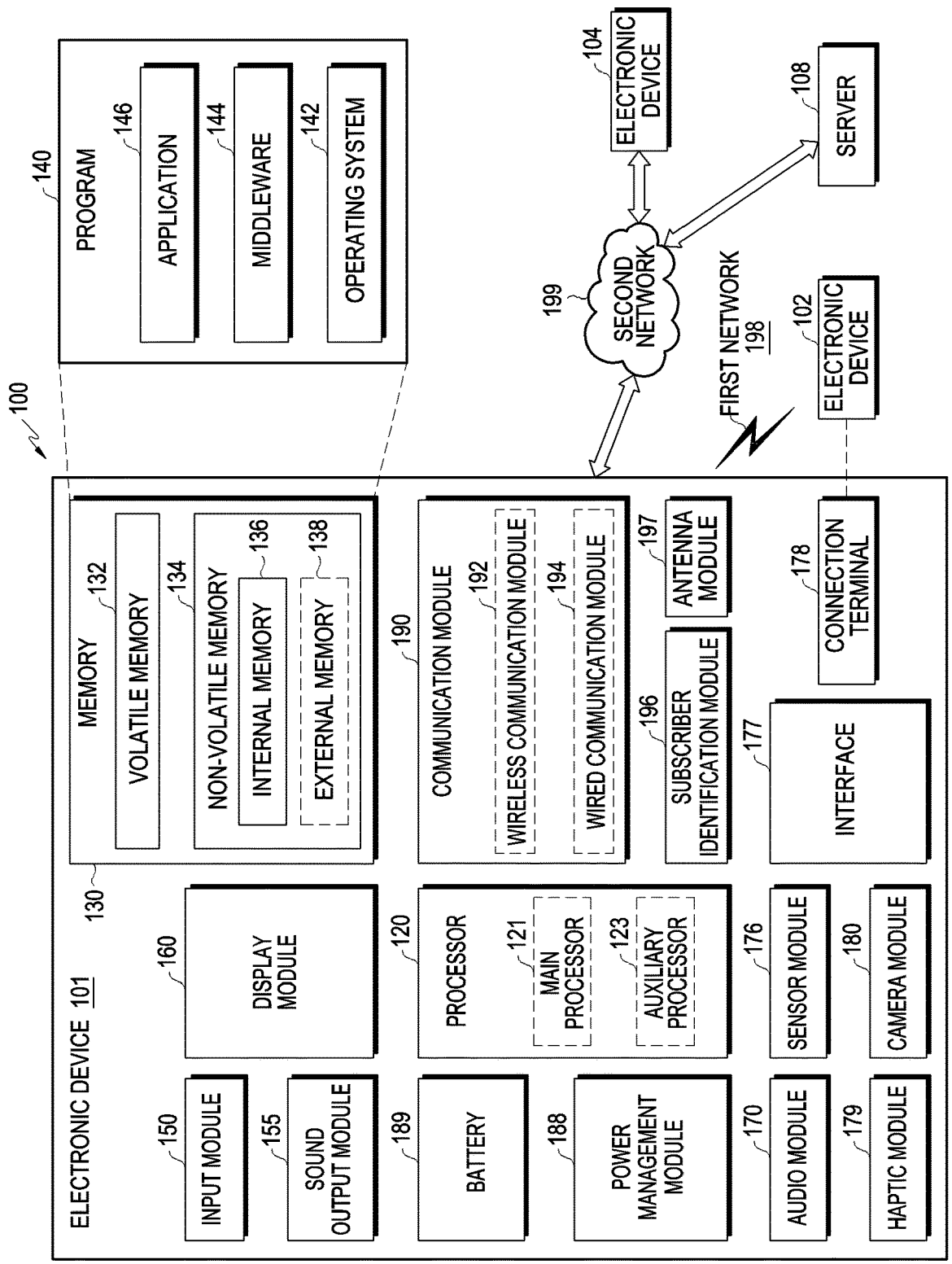
FIG. 1 is a block diagram illustrating an electronic device in a network environment according to an embodiment of the disclosure.

FIG. 1 is a block diagram illustrating an electronic device 101 in a network environment 100 according to an embodiment.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160). The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
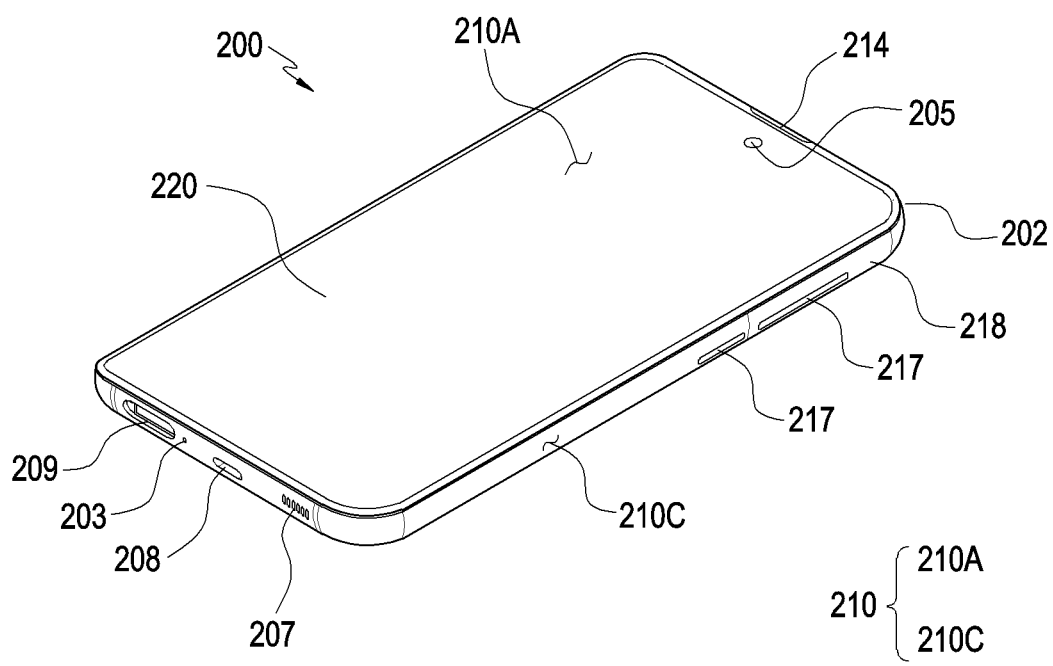
FIG. 2 is a front perspective view illustrating an electronic device according to an embodiment of the disclosure.
Figure 3:
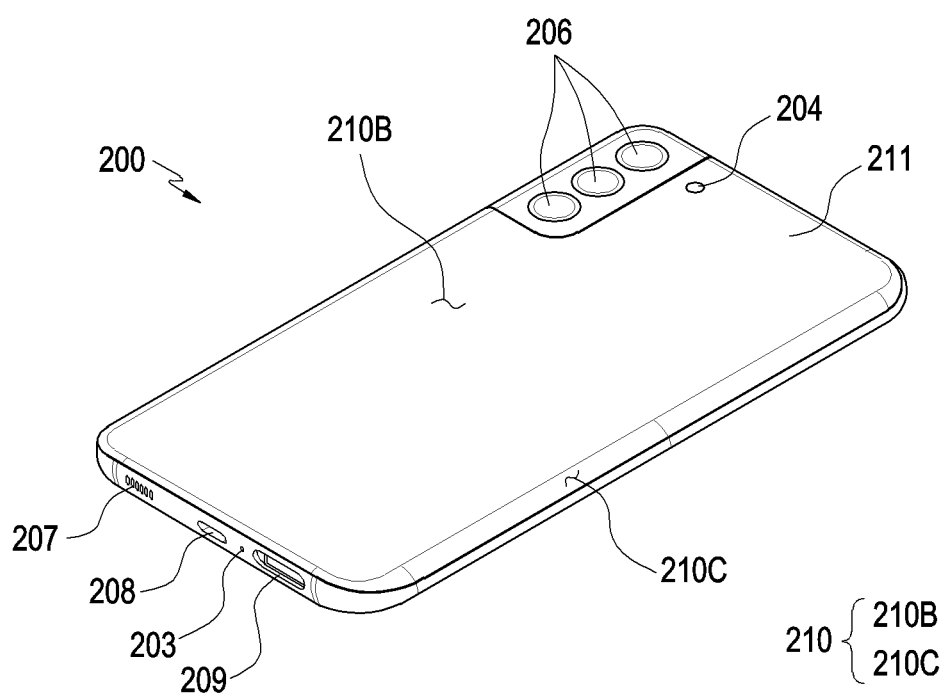
FIG. 3 is a rear perspective view illustrating an electronic device according to an embodiment of the disclosure.

FIG. 2 is a front perspective view illustrating an electronic device according to an embodiment of the disclosure. FIG. 3 is a rear perspective view illustrating the electronic device according to an embodiment of the disclosure.

Referring to FIGS. 2 and 3, an electronic device 200 according to an embodiment may include a housing 210 which includes a front surface 210A, a rear surface 210B, and a side surface 210C surrounding the space between the front surface 210A and the rear surface 210B. In another embodiment (not shown), the housing 210 may refer to a structure that forms a part of the front surface 210A of FIG. 2, the rear surface 210B of FIG. 3, and the side surface 210C. For example, the housing 210 may include a front plate 202 and a rear plate 211. According to an embodiment, at least a part of the front surface 210A may be implemented by the front plate 202 (e.g., glass plate or polymer plate including various coating layers) which is at least partially substantially transparent. The rear surface 210B may be implemented by the rear plate 211. The rear plate 211 may be made of, for example, glass, ceramic, polymer, metal (e.g., titanium (Ti), stainless steel (STS), aluminum (Al), and/or magnesium (Mg)), or a combination of at least two of these materials. The side surface 210C may be coupled with the front plate 202 and the rear plate 211 and may be implemented by a side bezel structure (or "side member") 218 including metal and/or polymer. In some embodiments, the rear plate 211 and the side bezel structure 218 may be integrated and include the same material (e.g., glass, metallic material such as aluminum, or ceramic). In another embodiment, the front surface 210A and/or the front plate 202 may be referred to as a part of the display 220.

According to an embodiment, the electronic device 200 may include at least one of the display 220, audio modules 203, 207, and 214 (e.g., the audio module 170 of FIG. 1), a sensor module (e.g., the sensor module 176 of FIG. 1), camera modules 205 and 206 (e.g., the camera module 180 of FIG. 1), key input devices 217 (e.g., the input module 150 of FIG. 1), or connector holes 208 and 209 (e.g., the connecting terminal 178 of FIG. 1). In some embodiments, the electronic device 200 may not be provided with at least one (e.g., the connector hole 209) of the components or additionally include other components. According to an embodiment, the display 220 may be visually exposed, for example, through a substantial portion of the front plate 202.

According to an embodiment, a surface (or the front plate 202) of the housing 210 may include a view area formed to visually expose the display 220. For example, the view area may include the front surface 210A.

In another embodiment (not shown), the electronic device 200 may include a recess or an opening formed in a part of the view area (e.g., the front surface 210A) of the display 220, which is used to seat at least one of the audio module 214, a sensor module (not shown), a light emitting element (not shown), or the camera module 205, so that these components are aligned with the recess or the opening. In another embodiment (not shown), the electronic device 200 may include at least one of the audio module 214, the sensor module (not shown), the camera module 205, a fingerprint sensor (not shown), or the light emitting element (not shown) on the rear surface of the view area of the display 220.

In another embodiment (not shown), the display 220 may be incorporated with or disposed adjacent to a touch sensing circuit, a pressure sensor that measures the intensity (pressure) of touches, and/or a digitizer that detects a magnetic field-based stylus pen.

In some embodiments, at least some of the key input devices 217 may be disposed in the side bezel structure 218.

According to an embodiment, the audio modules 203, 207, and 214 may include a microphone hole 203 and speaker holes 207 and 214. A microphone for obtaining external sound may be disposed in the microphone hole 203, and in some embodiments, a plurality of microphones may be disposed to detect the direction of the sound. The speaker holes 207 and 214 may include an external speaker hole 207 and a receiver hole 214 for telephone calls. In some embodiments, the speaker holes 207 and 214 and the microphone hole 203 may be implemented as a single hole, or a speaker (e.g., piezo speaker) that does not need the speaker holes 207 and 214 may be included.

According to an embodiment, the sensor module (not shown) may detect an internal operation state or external environmental state of the electronic device 200 and generate an electrical signal or data value corresponding to the detected state. The sensor module (not shown) may include, for example, a first sensor module (not shown) (e.g., proximity sensor) and/or a second sensor module (not shown) (e.g., fingerprint sensor), disposed on the front surface 210a. The sensor module (not shown) may include, for example, a third sensor module (not shown) (e.g., hear rate monitor (HRM) sensor) and/or a fourth sensor module (not shown) (e.g., fingerprint sensor), disposed on the rear surface 210B. In some embodiments (not shown), the fingerprint sensor may be disposed on the rear surface 210b as well as on the front surface 210a (e.g., the display 220). The electronic device 200 may further include another sensor module (not shown), such as a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

According to an embodiment, the camera modules 205 and 206 may include, for example, a front camera module 205 disposed on the front surface 210A of the electronic device 200, and a rear camera module 206 and/or a flash 204 disposed on the rear surface 210B of the electronic device 200. Each of the camera modules 205 and 206 may include one or more lenses, an image sensor, and/or an image signal processor. The flash 204 may include, for example, a light emitting diode (LED) or a xenon lamp. In some embodiments, two or more lenses (an IR camera, a wide-angle lens, and a telephoto lens) and image sensors may be arranged on one surface of the electronic device 200.

According to an embodiment, the key input devices 217 may be arranged on the side surface 210C of the housing 210. In another embodiment, the electronic device 200 may not include some or any of the above key input devices 217, and the key input devices 217 which are not included may be implemented in other forms such as soft keys on the display 220.

According to an embodiment, the light emitting element (not shown) may be disposed, for example, on the front surface 210A of the housing 210. The light emitting element (not shown) may provide, for example, state information about the electronic device 200 as flashes of light. In another embodiment, the light emitting element (not shown) may provide, for example, a light source interworking with the operations of the front camera module 205. The light emitting element (not shown) may include, for example, an LED, an IR LED, and/or a xenon lamp.

According to an embodiment, the connector holes 208 and 209 may include a first connector hole 208 that may accommodate a connector (e.g., universal serial bus (USB) connector) for transmitting and receiving power and/or data to and from an external electronic device and a connector (e.g., earphone jack) for transmitting and receiving an audio signal to and from an external electronic device, and/or a second connector hole 209 for accommodating a storage device (e.g., subscriber identity module (SIM) card). According to an embodiment, the connector holes 208 and 209 may be omitted.

Figure 4:
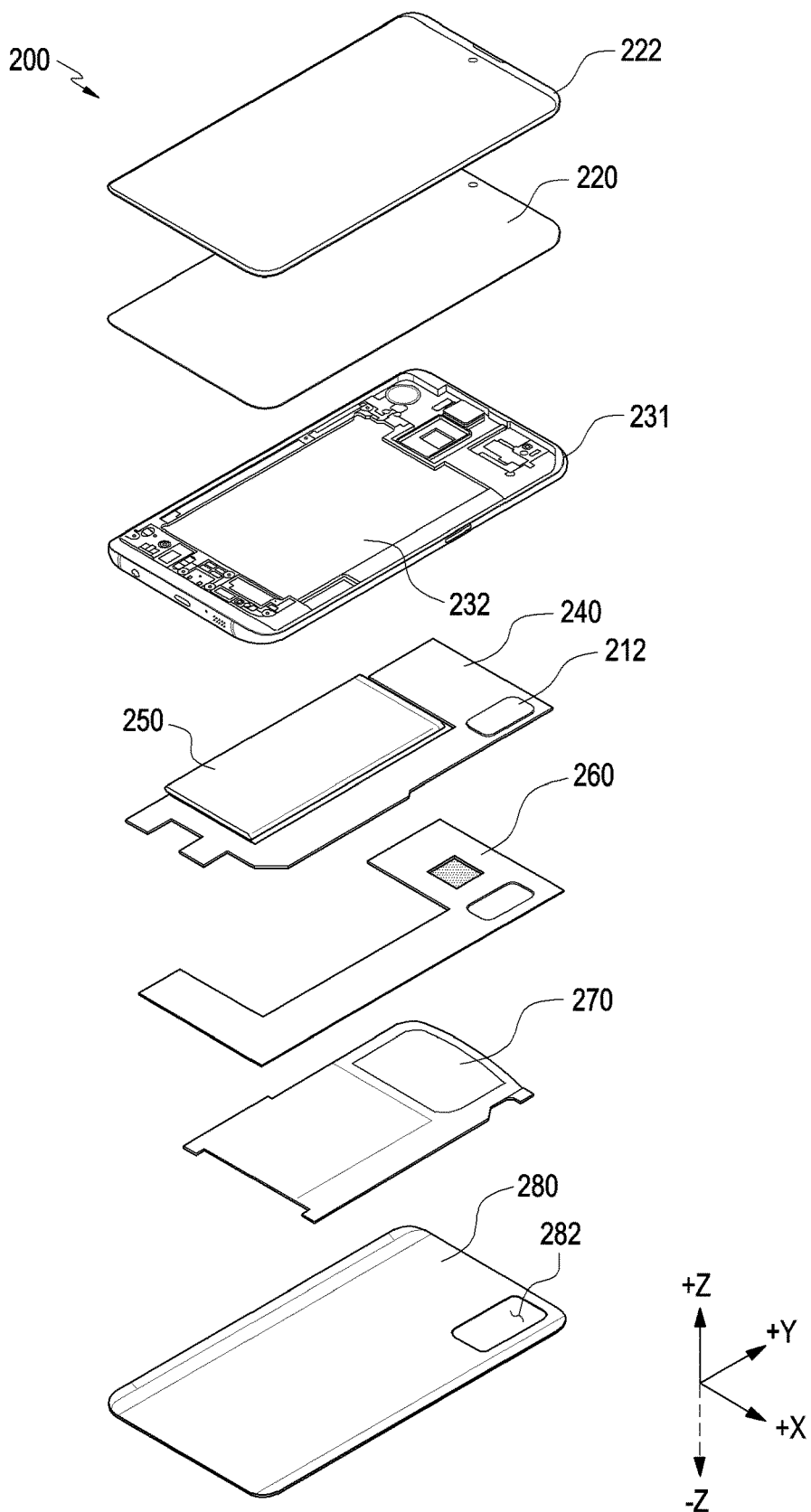
FIG. 4 is an exploded perspective view illustrating an electronic device according to an embodiment of the disclosure.

FIG. 4 is an exploded perspective view illustrating an electronic device according to an embodiment of the disclosure.

Referring to FIG. 4, the electronic device 200 (e.g., the electronic device 200 of FIGS. 2 and 3) may include at least one of a front plate 222 (e.g., the front plate 202 of FIG. 2), the display 220. (e.g., the display 220 of FIG. 2), a first support member 232 (e.g., bracket), a printed circuit board (PCB) 240, a battery 250, a second support member 260 (e.g., rear case), an antenna 270, or a rear plate 280 (e.g., the rear plate 211 of FIG. 3). In some embodiments, the electronic device 200 may not be provided with at least one (e.g., the first support member 232 or the second support member 260) of the components or further include other components. At least one of the components of the electronic device 200 may be the same as or similar to at least one of the components of the electronic device 200 illustrated in FIG. 2 or FIG. 3, and duplicative description will be avoided herein.

According to an embodiment, the first support member 232 may be disposed inside the electronic device 200 and coupled to a side bezel structure 231 or integrated with the side bezel structure 231. The first support member 232 may be made of, for example, metallic material and/or non-metallic material (e.g., polymer). The first support member 232 may have one surface coupled with the display 230 and the other surface coupled with the PCB 240. The PCB 240 may have a processor, a memory, and/or an interface mounted thereon. The processor may include, for example, at least one of a central processing unit (CPU), an application processor, a graphic processing device, an image signal processor, a sensor hub processor, or a communication processor. According to an embodiment, the memory may include, for example, a volatile memory or a non-volatile memory. According to an embodiment, the interface may include, for example, an HDMI, a USB interface, an SD card interface, and/or an audio interface. The interface may electrically or physically couple, for example, the electronic device 200 to an external electronic device, and may include a USB connector, an SD card/multimedia card (MMC) connector, or an audio connector. According to one embodiment, the battery 250 is a device for supplying power to at least one component of the electronic device 200, and may include, for example, a non-rechargeable primary cell, a rechargeable secondary cell, or a fuel battery. At least a part of the battery 250 may be disposed on the substantially same plane with, for example, the PCB 240. The battery 250 may be integrally disposed inside the electronic device 200, or may be disposed detachably from the electronic device 200.

According to an embodiment, the second support member 260 (e.g., the rear case) may be disposed between the PCB 240 and the antenna 270. For example, the second support member 260 may include one surface coupled with at least one of the PCB 240 or the battery 250 and the other surface coupled with the antenna 270.

According to an embodiment, the antenna 270 may be disposed between the rear plate 280 and the battery 250. The antenna 270 may include, for example, a near field communication (NFC) antenna, a wireless charging antenna, and/or a magnetic secure transmission (MST) antenna. The antenna 270 may, for example, perform short-range communication with an external device or wirelessly transmit and receive power required for charging to and from an external device. For example, the antenna 270 may include a coil for wireless charging. In another embodiment, an antenna structure may be formed by a part of the side bezel structure 231 and/or the first support member 232 or a combination thereof.

According to an embodiment, the electronic device 200 may include a camera module 212 disposed inside a housing (e.g., the housing 210 of FIG. 2). The camera module 212 may be a rear camera module (e.g., the camera module 212 of FIG. 3) which is disposed on the first support member 232, and may obtain an image of an object located behind the electronic device 200 (e.g., in the —Z direction). According to an embodiment, at least a part of the camera module 212 may be exposed to the outside of the electronic device 200 through an opening 282 formed in the rear plate 280.

The electronic device 200 illustrated in FIGS. 2 to 4 has a bar-type or plate-type configuration, which should not be construed as limiting the disclosure. For example, the illustrated electronic device may be a rollable electronic device or a foldable electronic device. The "rollable electronic device" refers to an electronic device in which its display (e.g., the display 220 of FIG. 4) is bendable to be deformed and thus at least partially wound or rolled or accommodated into the housing (e.g., the housing 210 of FIG. 2). According to the user's need, the rollable electronic device may extend the viewing area of the display by unfolding the display or exposing a larger area of the display. The "foldable electronic device" may refer to an electronic device in which its display is foldable such that two different areas of the display face each other or in opposite directions. In general, the display may be folded with two different areas facing each other or in opposing directions while not used, whereas the user may unfold the display and make the two different areas substantially flat during use. In some embodiments, the electronic device 200 according to certain embodiments of the disclosure may not be a portable electronic device such as a smart phone but also various other electronic devices such as a laptop computer, a wearable electronic device (e.g., smart watch), or a camera.

Figure 5:
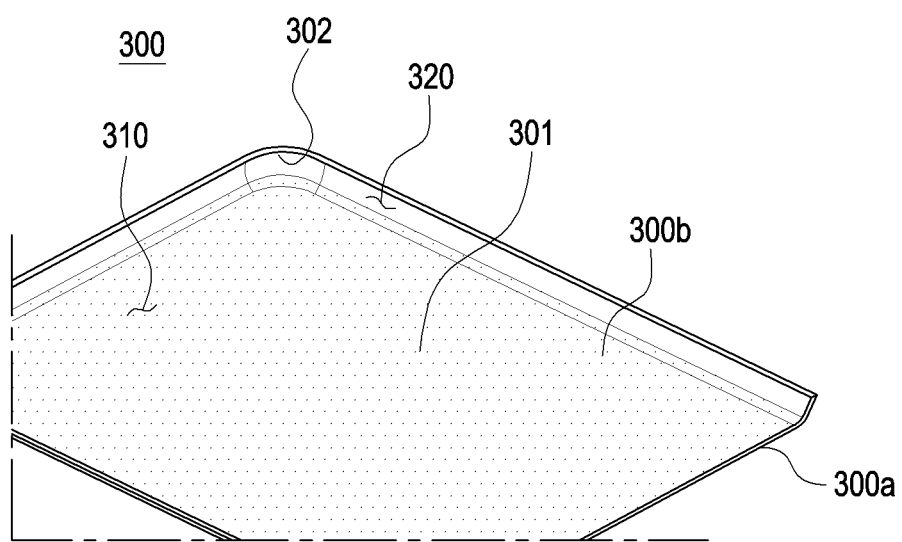
FIG. 5 is a perspective view illustrating a housing according to an embodiment of the disclosure.
Figure 6:
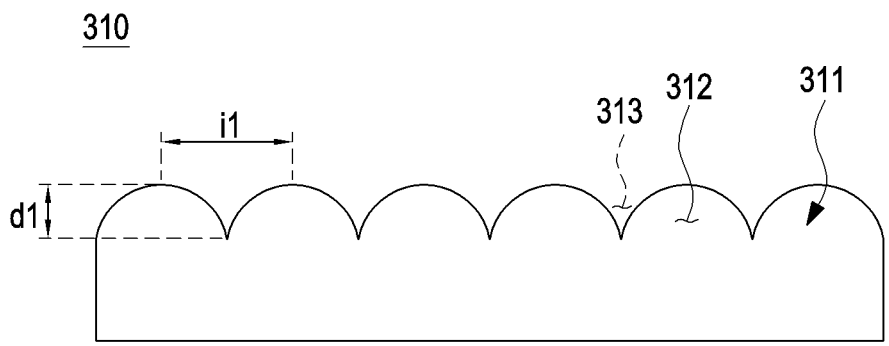
FIG. 6 is a sectional view illustrating a first region according to an embodiment of the disclosure.
Figure 7:
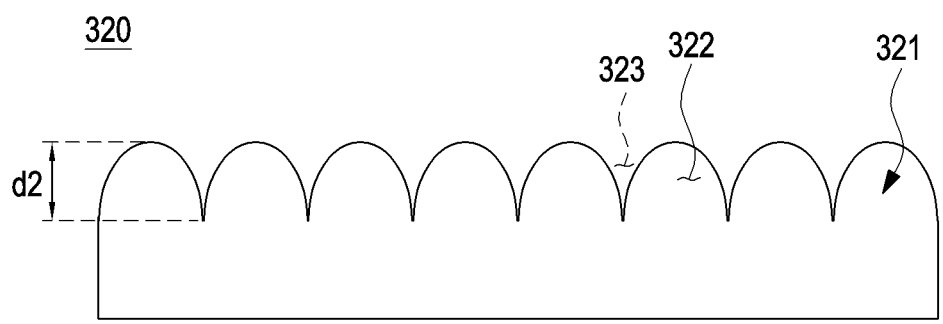
FIG. 7 is a sectional view illustrating a second region according to an embodiment of the disclosure.

FIG. 5 is a perspective view illustrating a housing according to an embodiment of the disclosure. FIG. 6 is a sectional view illustrating a first region according to an embodiment of the disclosure. FIG. 7 is a sectional view illustrating a second region according to an embodiment of the disclosure.

Referring to FIGS. 5 to 7, the rear plate 300 may include a first region 310 and a second region 320. The configuration of the rear plate 300 illustrated in FIG. 5 may be the same as or similar to that of the rear plate 280 illustrated in FIG. 4.

According to an embodiment, the rear plate 300 may include the first region 310 and the second region 320. According to an embodiment, the second region 320 may surround at least a part of the first region 310. For example, the second region 320 may form at least a part of the periphery of the rear plate 300. According to an embodiment, the first region 310 may include a first concavo-convex pattern 311. The second region 320 may include a second concavo-convex pattern 321.

According to an embodiment, the first region 310 may include the first concavo-convex pattern 311. According to an embodiment, the first concavo-convex pattern 311 may include a plurality of protrusions 312 and/or a plurality of grooves 313. The first concavo-convex pattern 311 may be formed to a first depth d1. For example, the protrusions 312 and/or the grooves 313 may be formed to the first depth d1. According to an embodiment, the first concavo-convex pattern 311 may be formed at substantially uniform intervals. For example, the first concavo-convex pattern 311 may be formed according to a first interval i1. According to an embodiment, the first interval i1 may be 30 μm to 50 μm. The first interval i1 may be referred to as the pitch between valleys or peaks in the first concavo-convex pattern 311.

Figure 10:
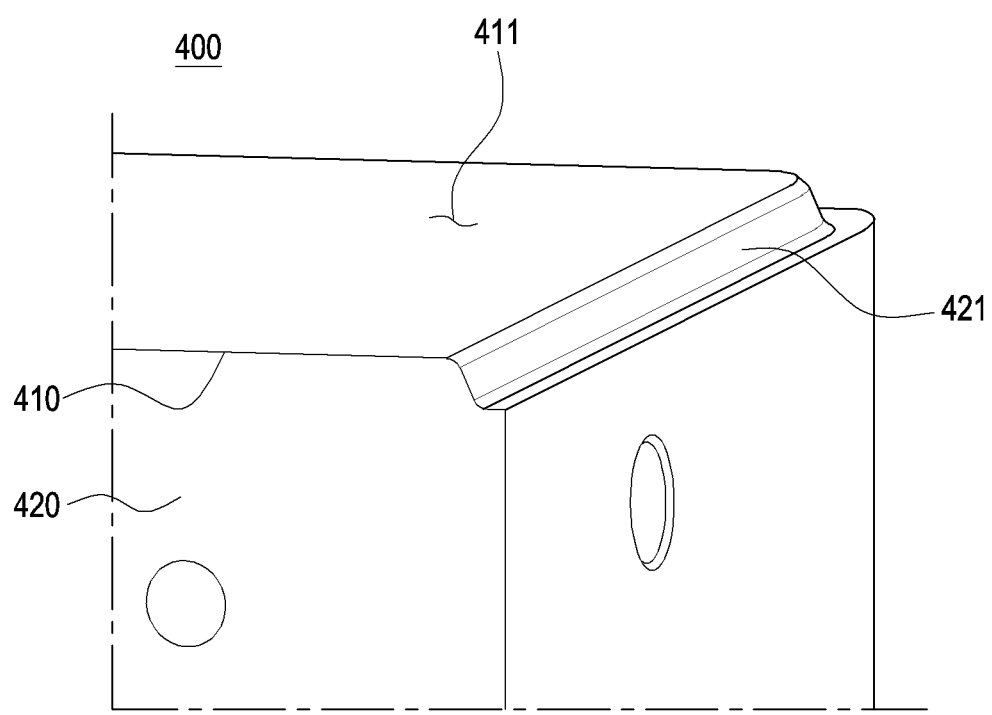
FIG. 10 is a perspective view illustrating a mold structure according to an embodiment of the disclosure.

According to an embodiment, the first concavo-convex pattern 311 may be formed using a mold (e.g., mold structure 400 of FIG. 10). For example, the first concavo-convex pattern 311 may be formed using a mold including a third concavo-convex pattern (e.g., third concavo-convex pattern 411 of FIG. 10) that is formed using a cutting tool.

According to an embodiment, the first concavo-convex pattern 311 may be referred to as an optical pattern. According to an embodiment, the first concavo-convex pattern 311 may implement a prism pattern and/or a lenticular pattern. For example, light incident on the first region 310 in which the first concavo-convex pattern 311 is located may be reflected and/or refracted at various angles in the first concavo-convex pattern 311. According to an embodiment, the first concavo-convex pattern 311 may be formed to a depth that is not perceptible by human touches. For example, the first depth d1 may be 1 μm to 10 μm.

According to an embodiment, the second region 320 may include the second concavo-convex pattern 321. According to an embodiment, the second concavo-convex pattern 321 may include a plurality of protrusions 322 and/or a plurality of grooves 323. The second concavo-convex pattern 321 may be formed to a second depth d2. For example, the protrusions 322 and/or the grooves 323 may be formed to the second depth d2. According to an embodiment, the second depth d2 may 10 μm or larger.

According to an embodiment, the second concavo-convex pattern 321 may be referred to as a texture pattern. According to an embodiment, the second depth d2 of the second concavo-convex pattern 321 may be different from the first depth d1 of the first concavo-convex pattern 311. For example, the second depth d2 may be greater than the first depth d1. According to an embodiment, the second concavo-convex pattern 321 may be formed to a depth that is perceptible by human touches. For example, the second depth d2 may be 200 μm to 500 μm. According to an embodiment, the second concavo-convex pattern 321 may be formed using a mold (e.g., the mold structure 400 of FIG. 10). For example, the second concavo-convex pattern 321 may be formed using a mold including a fourth concavo-convex pattern (e.g., fourth concavo-convex pattern 421 of FIG. 10) that is formed using a cutting tool.

According to an embodiment, a first light reflectance of the first concavo-convex pattern 311 may be different from a second light reflectance of the second concavo-convex pattern 321. According to an embodiment, in this way, the first region 310 in which the first concavo-convex pattern 311 is located and the second region 320 in which the second concavo-convex pattern 321 is located are visually distinguishable to the user. According to an embodiment, the first reflectance of the first concavo-convex pattern 311 may be 48 to 50%. According to an embodiment, a first transmittance of the first concavo-convex pattern 311 may be about 70%. According to an embodiment, the second reflectance and/or second transmittance of the second concavo-convex pattern 321 may be set to various values based on the process of forming the second concavo-convex pattern 321.

According to an embodiment, the first concavo-convex pattern 311 and the second concavo-convex pattern 321 may be formed using the same mold (e.g., the mold structure 400 of FIG. 10) having both the third concavo-convex pattern and the fourth concavo-convex pattern. According to an embodiment, the first concavo-convex pattern 311 and/or the second concavo-convex pattern 321 may be integrally formed with the rear plate 300. For example, the first concavo-convex pattern 311 and the second concavo-convex pattern 321 may extend or protrude from a first surface 300a and/or a second surface 300b of the rear plate 330. According to an embodiment, the first concavo-convex pattern 311 and/or the second concavo-convex pattern 321 may be formed to have various shapes. For example, while the first concavo-convex pattern 311 and/or the second concavo-convex pattern 321 is shown as including a curved surface in FIG. 6 and/or FIG. 7, the first concavo-convex pattern 311 and/or the second concavo-convex pattern 312 may be formed with substantially linear shapes instead.

According to an embodiment, the rear plate 300 may include the first surface 300a and the second surface 300b. According to an embodiment, the first surface 300a may be fully or partially implement the rear surface (e.g., the rear surface 210B of FIG. 3) of the electronic device (e.g., the electronic device 200 of FIG. 3), and the second surface 300b may be opposite to the first surface 300a.

According to an embodiment, the rear plate 300 may include a center portion 301 and a peripheral portion 302. According to an embodiment, the center portion 301 may face at least a part of a component (e.g., the battery 250 of FIG. 4) of the electronic device (e.g., the electronic device 200 of FIG. 4). According to an embodiment, the peripheral portion 302 may surround at least a part of the center portion 301. According to an embodiment, the peripheral portion 302 may be connected to a side bezel structure (e.g., the side bezel structure 231 of FIG. 4) or may be integrated with the side bezel structure 231.

According to an embodiment, at least a part of the first region 310 and at least a part of the second region 320 may overlap each other. According to an embodiment, the first region 310 may be located on the first surface 300a of the rear plate 300, and the second region 320 may be located on the second surface 300b of the rear plate 300. For example, the first concavo-convex pattern 311 may be formed on the first surface 300a, and the second concavo-convex pattern 321 may be formed on the second surface 300b. According to an embodiment, the first region 310 may be located on the second surface 300b of the rear plate 300, and the second region 320 may be located on the first surface 300a of the rear plate 300. For example, the first concavo-convex pattern 311 may be formed on the second surface 300b, and the second concavo-convex pattern 321 may be formed on the first surface 300a. According to an embodiment, at least a part of the rear plate 300 may be substantially transparent.

According to an embodiment, at least a part of the first region 310 and at least a part of the second region 320 may be located on the same plane. According to an embodiment, the first region 310 and the second region 320 may be located on the first surface 300a. According to an embodiment, the first region 310 and the second region 320 may be located on the second surface 300b of the rear plate 300. According to an embodiment, the first region 310 may be spaced apart from the second region 320. For example, the first region 310 may be located in the center portion 301, and the second region 320 may be located in the peripheral portion 302. In another example, the first region 310 may be located at the peripheral portion 302, and the second region 320 may be located at the center portion 301.

According to an embodiment, the rear plate 300 may be formed by injection molding. According to an embodiment, the rear plate 300 may include a resin.

Figure 8A:
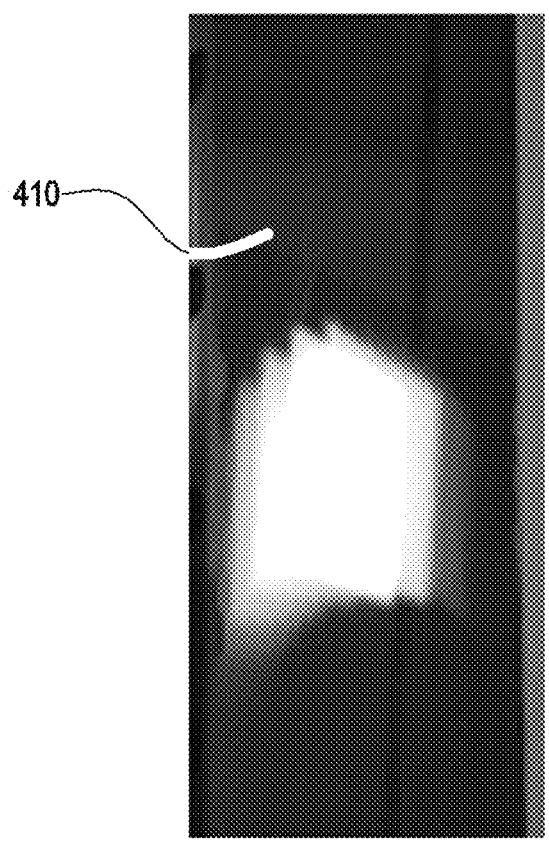
FIG. 8A is a photograph of a mold structure for forming a first concavo-convex pattern according to an embodiment of the disclosure.
Figures 8B, 8C:
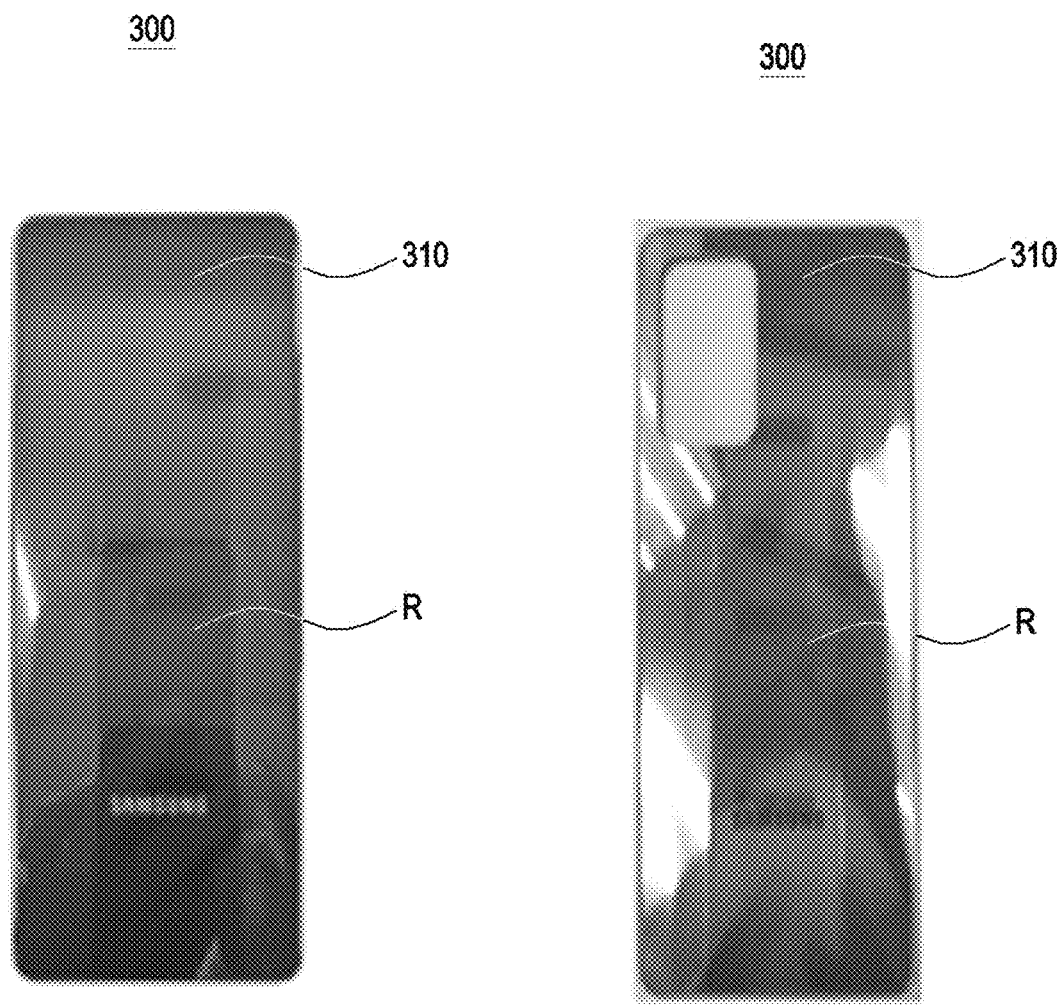
FIGS. 8B and 8C are photographs of a first region in which the first concavo-convex pattern is formed according to certain embodiments of the disclosure.

FIG. 8A is a photograph of a mold structure for forming a first concavo-convex pattern according to an embodiment of the disclosure, and FIGS. 8B and 8C are photographs of a first region in which the first concavo-convex pattern is formed according to certain embodiments of the disclosure. Referring to FIGS. 8A, 8B and 8C, the first region 310 of the rear plate 300 may provide an optical pattern. For example, at least a part of an image incident on the rear plate 300 may be reflected and represented in a plurality of shapes. For example, the first region 310 may provide a reflected image R of an object located outside the rear plate 300. According to an embodiment, the apparent texture of the rear plate 300 recognized by the user may be changed by light reflected from the first region 310 in which the first concavo-convex pattern (e.g., the first concavo-convex pattern 311 of FIG. 6) is formed. According to an embodiment, at least a part (e.g., the plating layer 410 and/or the third concavo-convex pattern 411 of FIG. 10) located on a core portion 420 for forming the rear plate 300 may reflect at least a part of the light transmitted from the outside of the core portion 420. The configuration of the rear plate 300 of FIGS. 8B and 8C may be fully or partially identical to that of the rear plate 300 of FIG. 5, and the configuration of the core portion 420 of FIG. 8A may be fully or partially identical to that of the core portion 420 of FIG. 10.

Figure 9A:
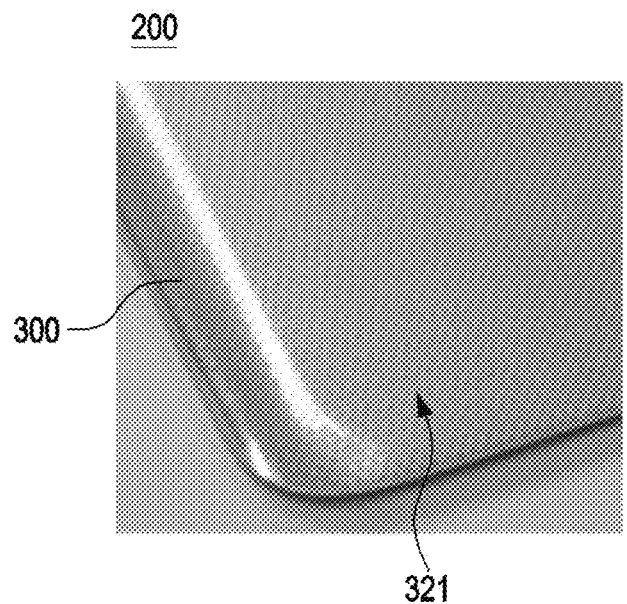
FIGS. 9A, 9B and 9C are photographs of a second region in which a second concavo-convex pattern is formed according to certain embodiments of the disclosure.
Figure 9B:
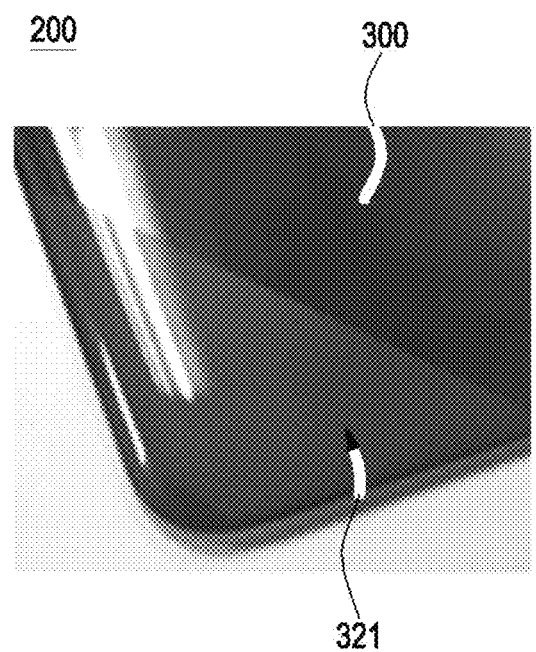
Figure 9C:
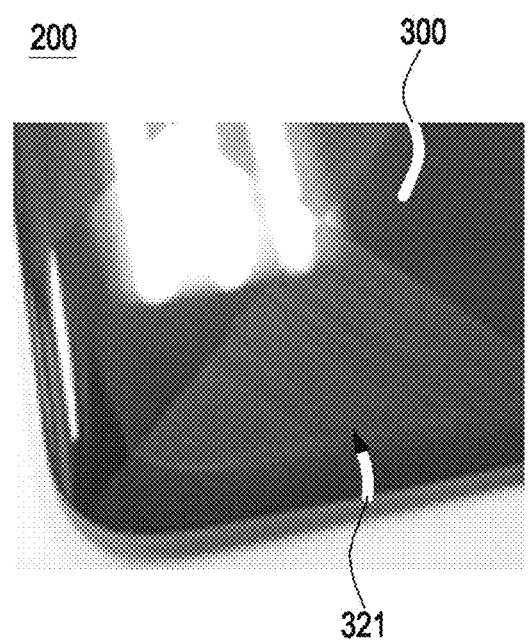

FIGS. 9A, 9B and 9C are photographs of a second region in which a second concavo-convex pattern is formed, according to certain embodiments of the disclosure.

Referring to FIGS. 9A to 9C, the rear plate 300 may include the second concavo-convex pattern 321 capable of implementing various textures. According to FIGS. 9A, 9B and 9C, the configuration of the rear plate 300 and/or the second concavo-convex pattern 321 may be fully or partially identical to that of the rear plate 300 and/or the second concavo-convex pattern 321 of FIG. 5.

According to an embodiment, the second concavo-convex pattern 321 may be formed using a mold (e.g., the mold structure 400 of FIG. 10) that in turn is formed using various processes such as mirror polishing, numerical processing, chemical corrosion, blasting, or laser processing. For example, the second concavo-convex pattern 321 may be formed using the mold structure 400 including a fourth concavo-convex pattern (e.g., the fourth concavo-convex pattern 421 of FIG. 10) that is in a shape corresponding to the second concavo-convex pattern 321. The fourth concavo-convex pattern 421 of the mold structure 400 may be formed using at least one of mirror polishing, numerical processing, chemical corrosion, blasting, or laser processing.

According to an embodiment, the second concavo-convex pattern 321 may be formed in various textures. According to an embodiment (e.g., FIG. 9A), the second concavo-convex pattern 321 may be injected using a mold (e.g., the mold structure 400 of FIG. 10) formed by chemical corrosion. According to an embodiment (e.g., FIGS. 9B and 9C), the second region 320 may be formed by mirror polishing. According to an embodiment (e.g., FIG. 9C), the second region 320 may include a hair line.

FIG. 10 is a perspective view illustrating a mold structure according to an embodiment of the disclosure.

Referring to FIG. 10, a rear plate (e.g., the rear plate 300 of FIG. 5) of an electronic device (e.g., the electronic device 200 of FIG. 2) may be formed using the mold structure 400.

According to an embodiment, the mold structure 400 may include the core portion 420 and the plating layer 410 disposed on the core portion 420. According to an embodiment, the rigidity of the plating layer 410 may be lower than that of the core portion 420. For example, the core portion 420 may include carbon (C), and the plating layer 410 may include an electroless nickel (Ni) plating layer.

According to an embodiment, the mold structure 400 may include the third concavo-convex pattern 411. According to an embodiment, the third concavo-convex pattern 411 may be formed on the plating layer 410, using a carbon-based (e.g., diamond) cutting tool. According to an embodiment, the third concavo-convex pattern 411 may include grooves and/or protrusions formed on the plating layer 410. According to an embodiment, the rear plate (e.g., the rear plate 300 of FIG. 5) may be formed using the third concavo-convex pattern 411. For example, at least a part (e.g., the first concavo-convex pattern 311 of FIG. 6) of the rear plate 300 may be injected to have a shape corresponding to the shape of the third concavo-convex pattern 411.

According to an embodiment, the mold structure 400 may include the fourth concavo-convex pattern 421. According to an embodiment, the fourth concavo-convex pattern 421 may be formed using a method different from that for the third concavo-convex pattern 411. For example, the fourth concavo-convex pattern 421 may be formed using at least one of mirror polishing, numerical processing, chemical corrosion, blasting, or laser processing. According to an embodiment, the fourth concavo-convex pattern 421 may include grooves or protrusions formed in the core portion 420 of the mold structure 400. According to an embodiment, the rear plate (e.g., the rear plate 300 of FIG. 5) may be formed using the fourth concavo-convex pattern 421. For example, at least a part (e.g., the second concavo-convex pattern 321 of FIG. 7) of the rear plate 300 may be injected to have a shape corresponding to the shape of the fourth concavo-convex pattern 421.

According to an embodiment of the disclosure, an electronic device (e.g., the electronic device 200) may include a housing (e.g., the housing 210 of FIG. 2) including a rear plate (e.g., the rear plate 300 of FIG. 5) including a first region (e.g., the first region 310 of FIG. 6) having a first concavo-convex pattern (e.g., the concavo-convex pattern 311 of FIG. 6) formed therein, and a second region (e.g., the second region 320 of FIG. 6) having a second concavo-convex pattern (e.g., the second concavo-convex pattern 321 of FIG. 6) formed therein, and a processor (e.g., the processor 120 of FIG. 1) disposed inside the housing. The first concavo-convex pattern and the second concavo-convex pattern may be integrally formed with the rear plate, and a first depth (e.g., the first depth d1 of FIG. 6) of the first concavo-convex pattern may be different from a second depth (e.g., the second depth d2 of FIG. 6) of the second concavo-convex pattern.

According to an embodiment, the rear plate may include a first surface (e.g., the first surface 300a of FIG. 5) exposed to an outside of the electronic device and a second surface (e.g., the second surface 300b of FIG. 5) opposite to the first surface. The first region may be located on the first surface, and the second region may be located on the second surface.

According to an embodiment, at least a part of the first region may overlap with at least a part of the second region.

According to an embodiment, the first region may have a first light reflectance, and the second region may have a second light reflectance different from the first light reflectance.

According to an embodiment, the electronic device may further include a battery (e.g., the battery 250 of FIG. 4) disposed inside the housing. The rear plate may include a center portion (e.g., the center portion 301 of FIG. 5) at least partially facing the battery, and a peripheral portion (e.g., the peripheral portion 302 of FIG. 5) extending from the center portion and surrounding at least a part of the center portion. The first region may be located in the center portion, and the second region may be located in the peripheral portion.

According to an embodiment, the rear plate may include a first surface (e.g., the first surface 300a of FIG. 5) exposed to an outside of the electronic device, and a second surface (e.g., the second surface 300b of FIG. 5) opposite to the first surface, and the first region and the second region may be located on the second surface.

According to an embodiment, the first depth of the first concavo-convex pattern may be 1 to 10 μm, and the second depth of the second concavo-convex pattern may be 200 to 500 μm.

According to an embodiment, the first concavo-convex pattern may be a prism pattern and/or a lenticular pattern.

According to an embodiment, the first concavo-convex pattern may be formed at substantially uniform intervals.

According to an embodiment, the housing may be formed molding by injection using a mold structure (e.g., the mold structure 400 of FIG. 10) including a third concavo-convex pattern (e.g., the third concavo-convex pattern 411 of FIG. 10) in a shape corresponding to the first concavo-convex pattern and a fourth concavo-convex pattern (e.g., the fourth concavo-convex pattern 421 of FIG. 10) in a shape corresponding to the second concavo-convex pattern.

According to an embodiment, the third concavo-convex pattern may be formed using a diamond-based cutting tool.

According to an embodiment, the fourth concavo-convex pattern may be formed by mirror polishing, numerical processing, chemical corrosion, blasting, and/or laser processing.

According to an embodiment, the mold structure may include a core portion (e.g., the core portion 420 of FIG. 10), and a plating layer (e.g., the plating layer 410 of FIG. 10) disposed on the core portion and having the third concavo-convex pattern formed thereon.

According to an embodiment, the rear plate may include a resin.

According to an embodiment, the rear plate may be substantially transparent.

According to an embodiment of the disclosure, a housing (e.g., the housing 210 of FIG. 2) may include a front plate (e.g., the front plate 202 of FIG. 2), and a rear plate (e.g., the rear plate 211 of FIG. 3) including a first region (e.g., the first region 310 of FIG. 6) having a first concavo-convex pattern (e.g., the first concavo-convex pattern 311 of FIG. 6) of a first depth (e.g., the first depth d1 of FIG. 6) formed therein, and a second region (e.g., the second region 320 of FIG. 6) having a second concavo-convex pattern (e.g., the second concavo-convex pattern 321 of FIG. 6) of a second depth (e.g., the second depth d2) formed therein. The first concavo-convex pattern and the second concavo-convex pattern may be integrally formed with the rear plate.

According to an embodiment, the rear plate may include a first surface (e.g., the first surface 300a of FIG. 5) on which the first region is located, and a second surface (e.g., the second surface 300b of FIG. 5) opposite to the first surface, on which the second region is located.

According to an embodiment, the first region may have a first light reflectance, and the second region may have a second light reflectance different from the first light reflectance.

According to an embodiment, the rear plate may include a first surface (e.g., the first surface 300a of FIG. 5) exposed to an outside of an electronic device having the housing, and a second surface (e.g., the second surface 300b of FIG. 5) opposite to the first surface, and the first region and the second region may be located on the second surface.

According to an embodiment, the first concavo-convex pattern may be a prism pattern and/or a lenticular pattern.

The above-described electronic device including a support member of the disclosure is not limited to the above-described embodiments and drawings, and it will be apparent to those skilled in the art that various substitutions, modifications, and changes can be made within the technical scope of the disclosure.

What is claimed is:

1. An electronic device comprising:
a housing including a rear plate including a first surface exposed to an outside of the electronic device, a second surface opposite to the first surface and disposed in the housing, a first region having a first concavo-convex pattern formed therein, and a second region disposed around an edge of the first region and having a second concavo-convex pattern formed therein, wherein the first region and the second region are disposed on the second surface; and
a processor disposed inside the housing,
wherein the rear plate is formed by injection molding using a mold structure such that the first concavo-convex pattern and the second concavo-convex pattern are integrally formed with the rear plate, the mold structure including a third concavo-convex pattern in a shape corresponding to the first concavo-convex pattern and a fourth concavo-convex pattern disposed around an edge of the third concavo-convex pattern and in a shape corresponding to the second concavo-convex pattern, and
wherein a ratio of a first depth of the first concavo-convex pattern and a second depth of the second concavo-convex pattern is set to 1:20 to 1:500 such that the first region has a first light reflectance and the second region has a second light reflectance different from the first light reflectance.

2. The electronic device of claim 1, further comprising a battery disposed inside the housing,
wherein the rear plate includes a center portion at least partially facing the battery, and a peripheral portion extending from the center portion and surrounding at least a part of the center portion, and
wherein the first region is located in the center portion, and the second region is located in the peripheral portion.

3. The electronic device of claim 1, wherein the first depth of the first concavo-convex pattern is 1 to 10 μm, and the second depth of the second concavo-convex pattern is 200 to 500 μm.

4. The electronic device of claim 1, wherein the first concavo-convex pattern is a prism pattern and/or a lenticular pattern.

5. The electronic device of claim 1, wherein the first concavo-convex pattern is formed at substantially uniform intervals.

6. The electronic device of claim 1, wherein the third concavo-convex pattern is formed using a diamond-based cutting tool.

7. The electronic device of claim 1, wherein the fourth concavo-convex pattern is formed by mirror polishing, numerical processing, chemical corrosion, blasting, and/or laser processing.

8. The electronic device of claim 1, wherein the mold structure includes a core portion, and a plating layer disposed on the core portion and having the third concavo-convex pattern formed thereon.

9. The electronic device of claim 1, wherein the rear plate includes a resin.

10. The electronic device of claim 1, wherein the rear plate is at least partially transparent.

* * * * *